(12) United States Patent
Kanaya

(10) Patent No.: US 9,935,589 B2
(45) Date of Patent: Apr. 3, 2018

(54) LINEARIZER

(71) Applicant: Mitsubishi Electric Corporation, Tokyo (JP)

(72) Inventor: Ko Kanaya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 23 days.

(21) Appl. No.: 14/638,212

(22) Filed: Mar. 4, 2015

(65) Prior Publication Data

US 2015/0341000 A1    Nov. 26, 2015

(30) Foreign Application Priority Data

May 23, 2014   (JP) ................................. 2014-107357

(51) Int. Cl.
| | | |
|---|---|---|
| H03F 1/32 | (2006.01) | |
| H03F 3/195 | (2006.01) | |
| H03F 3/21 | (2006.01) | |
| H03F 3/24 | (2006.01) | |
| H03F 3/68 | (2006.01) | |
| H03F 3/60 | (2006.01) | |

(52) U.S. Cl.
CPC ............ *H03F 1/3258* (2013.01); *H03F 1/32* (2013.01); *H03F 3/195* (2013.01); *H03F 3/211* (2013.01); *H03F 3/245* (2013.01); *H03F 3/602* (2013.01); *H03F 3/68* (2013.01); *H03F 2200/387* (2013.01); *H03F 2201/3215* (2013.01)

(58) Field of Classification Search
CPC ............. H03F 1/3258; H03F 2200/387; H03F 2201/3215; H03F 1/32; H03F 1/3241; H03F 1/3252; H03F 2201/32
See application file for complete search history.

(56) References Cited

U.S. PATENT DOCUMENTS

| | | | |
|---|---|---|---|
| 5,424,680 A | * | 6/1995 | Nazarathy ............. H03F 1/3252 327/133 |
| 6,166,604 A | | 12/2000 | Matsunaga |
| 2007/0008039 A1 | | 1/2007 | Kim |

(Continued)

FOREIGN PATENT DOCUMENTS

| | | |
|---|---|---|
| CN | 103414435 A | 11/2013 |
| JP | 2010-233055 A | 10/2010 |

(Continued)

OTHER PUBLICATIONS

On Office Action issued by the Korean Patent Office dated Dec. 7, 2016, which corresponds to Korean Patent Application No. 10-2015-0065099 and is related to U.S. Appl. No. 14/638,212; with English language partial translation.

(Continued)

*Primary Examiner* — Jung Kim

(74) *Attorney, Agent, or Firm* — Studebaker & Brackett PC

(57) ABSTRACT

A linearizer includes: a branch circuit having an input transmission line connected between an input terminal and a branch point, a first output transmission line connected between the branch point and a first output terminal, and a second output transmission line connected between the branch point and a second output terminal; a diode having an anode connected to the branch point and a cathode; and a bias circuit biasing the diode.

5 Claims, 6 Drawing Sheets

(56) References Cited

U.S. PATENT DOCUMENTS

2009/0297153 A1* 12/2009 Mutalik .............. H04B 10/58
398/81

FOREIGN PATENT DOCUMENTS

| JP | 2012-244545 A | 12/2012 |
|----|---------------|---------|
| KR | 2007-0006034 A | 1/2007 |

OTHER PUBLICATIONS

An Office Action issued by the Korean Patent Office dated Feb. 29, 2016, which corresponds to Korean Patent Application No. 10-2015-0065099 and is related to U.S. Appl. No. 14/638,212; with English language artial translation.

An Office Action issued by the Korean Patent Office dated Sep. 29, 2016, which corresponds to Korean Patent Application No. 10-2015-0065099 and is related to U.S. Appl. No. 14/638,212; with English language partial translation.

An Office Action issued by the Chinese Patent Office dated Jun. 23, 2017, which corresponds to Chinese Patent Application 201510266552.1 and is related to U.S. Appl. No. 14/638,212; with partial English translation.

An Office Action issued by the Japanese Patent Office dated Nov. 7, 2017, which corresponds to Japanese Patent Application No. 2014-107357 and is related to U.S. Appl. No. 14/638,212; with English translation.

* cited by examiner

LINEARIZER

BACKGROUND OF THE INVENTION

Field of the Invention

The present invention relates to a linearizer connected to a high-frequency amplifier to improve distortion characteristics.

Background Art

In recent years, research and development into transistors using a nitride semiconductor (e.g., GaN) are being actively carried out, and an application example thereof is a high output amplifier for communication. Amplifiers using GaN are enabled to have higher output than conventional compound semiconductors (e.g., GaAs). However, particularly an AMAM characteristic (output level characteristic when an input level is increased) deteriorates due to GaN-specific soft compression in which a gain slowly decreases from low input power.

Thus, as analog predistortion that compensates for the AMAM characteristic, linearizers using a diode are used (e.g., see Japanese Patent Application Laid-Open No. 2012-244545). Linearizers having a small circuit configuration are particularly preferable because GaN-based amplifier MMICs use an expensive epitaxial substrate.

SUMMARY OF THE INVENTION

Despite its small size, when a linearizer is simply cascade-connected to an amplifier, an increase in a circuit area is inevitable compared to an amplifier without any linearizer. Therefore, the area occupied by an expensive epitaxial substrate increases, resulting in a problem of cost increase.

Diodes for a linearizer used in a GaN-MMIC are generally Schottky barrier diodes. Regarding cell sizes of the diodes in this case, cells having a small unit anode width Wau and having many fingers are desirable. There are the following two reasons for this. First, a linearizer having a small unit anode width Wau makes it easier to reduce insertion loss of the linearizer. FIG. 12 is a diagram illustrating unit anode width Wau dependency of an AMAM characteristic of a linearizer. It is observed that the insertion loss is largest when the unit anode width Wau is 20 μm. Second, when an overcurrent is passed through an anode metal, electromigration occurs in an anode electrode, and therefore the current capacity of the anode metal is limited in terms of reliability. To avoid this problem, it is necessary to minimize the current value per finger by increasing the number of fingers.

On the other hand, it is difficult to control the boundary of an active region that determines the unit anode width Wau in a wafer process and a variation of the unit anode width Wau increases. Especially when the unit anode width Wau is small, the amount of variation with respect to the entire unit anode width appears large, and therefore the diode characteristic varies greatly and the variation of the linearizer characteristic increases. Conversely, when the unit anode width Wau is large, the amount of variation with respect to the entire unit anode width decreases, and therefore the characteristics vary less. Thus, a large unit anode width Wau is preferable from the standpoint of manufacturing yield. Therefore, the problem is that there is a trade-off relationship between the insertion loss and manufacturing yield.

The present invention has been implemented to solve the above-described problems and it is an object of the present invention to provide a linearizer that can increase the yield while reducing cost and insertion loss.

According to the present invention, a linearizer includes: a branch circuit having an input transmission line connected between an input terminal and a branch point, a first output transmission line connected between the branch point and a first output terminal, and a second output transmission line connected between the branch point and a second output terminal; a diode having an anode connected to the branch point and a cathode; and a bias circuit biasing the diode.

Because there are two output side circuits in the present invention, an impedance of the branch circuit in the present embodiment is lower than that in the example having one output side circuit. Thus, high-frequency signals are less likely to be affected by the diode, and it is thereby possible to reduce insertion loss of the diode. Therefore, even using the diode having a large unit anode width whose insertion loss is likely to increase, it is possible to reduce insertion loss. The diode having a large unit anode width has a smaller characteristic variation and thereby has a high manufacturing yield. Thus, the present invention can increase the yield while reducing insertion loss.

When amplifiers are configured in a tournament form, there tends to be extra space in layout near a branch point. In the present invention, since the linearizer is provided at this branch point, it is possible to insert the linearizer while preventing the circuit area from increasing. This prevents the area occupied by an expensive epitaxial substrate from increasing, and can thereby reduce cost.

Other and further objects, features and advantages of the invention will appear more fully from the following description.

DETAILED DESCRIPTION OF THE PREFERRED EMBODIMENTS

A linearizer according to the embodiments of the present invention will be described with reference to the drawings. The same components will be denoted by the same symbols, and the repeated description thereof may be omitted.

First Embodiment

Figure 1:
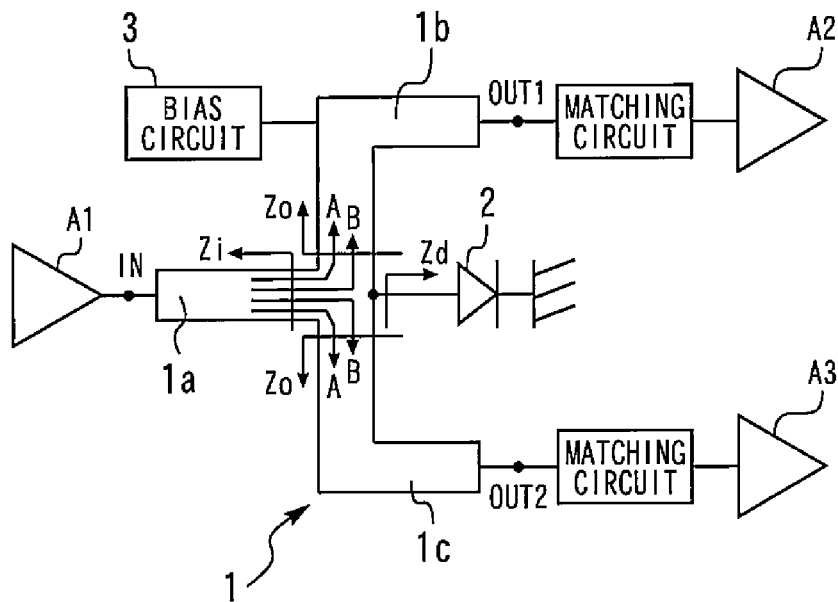
FIG. 1 is a diagram illustrating a linearizer according to a first embodiment of the present invention.
Figure 2:
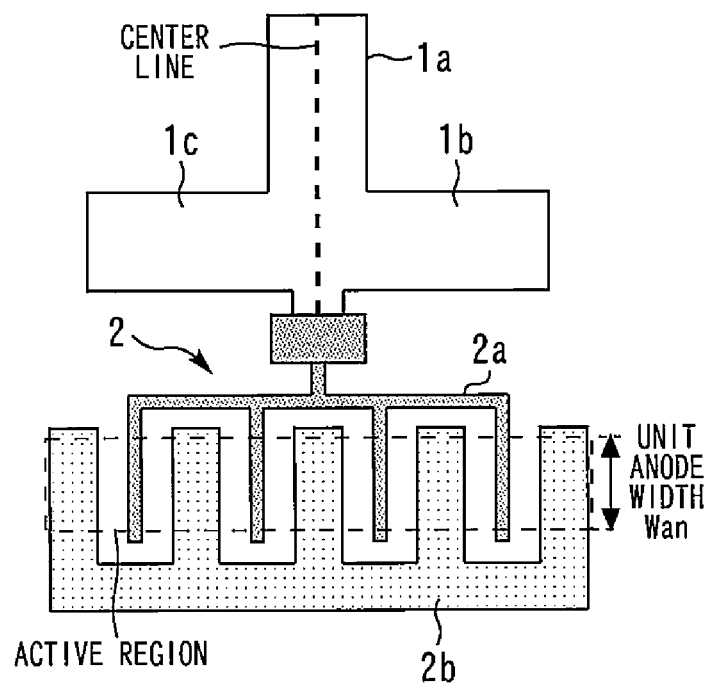
FIG. 2 is a partially enlarged view of the linearizer in FIG. 1.

FIG. 1 is a diagram illustrating a linearizer according to a first embodiment of the present invention. FIG. 2 is a partially enlarged view of the linearizer in FIG. 1. The linearizer is inserted between an upstream amplifier A1 and downstream amplifiers A2 and A3. A branch circuit 1 of the linearizer has an input transmission line 1a and output transmission lines 1b and 1c. The input transmission line 1a is connected between an input terminal IN and a branch point. The output transmission line 1b is connected between a branch point and an output terminal OUT1, and the output transmission line 1c is connected between the branch point and an output terminal OUT2.

An anode of a diode 2 is connected to the branch point of the branch circuit 1 and a cathode thereof is grounded. In the present embodiment, the anode of the diode 2 is connected on an extension of a center line of the input transmission line 1a. A bias circuit 3 biases the diode 2 in a forward direction. Anode fingers 2a and cathode fingers 2b of the diode 2 are alternately arranged. The width of an active region of the diode 2 is a unit anode width Wau.

A high-frequency signal generally has a nature that it passes on the inside of a bifurcated line. Thus, in FIG. 1, the high-frequency signal is more likely to pass through a path A than a path B. The high-frequency signal that passes through the path A passes without perceiving the diode 2. It is when the high-frequency signal passes through the path B that a loss is caused by the linearizer. Such a path of the high-frequency signal depends on an impedance relative to the branch point as a starting point.

When the impedance of the diode 2 is lower than the impedance of the branch circuit 1, that is, when equation (1) is satisfied, the insertion loss of the linearizer increases. Here, Zd is an impedance of the diode 2, Zi is an impedance when the input transmission line side is seen from the branch point and Zo is an impedance when the output transmission line side is seen from the branch point.

$$Z_d < \frac{Z_i Z_o}{2Z_i + Z_o} \quad (1)$$

On the other hand, when the impedance of the diode 2 is higher than the impedance of the branch circuit 1, that is, when equation (2) is satisfied, part of the high-frequency signal passes through the input transmission line 1a and goes out of the output transmission lines 1b and 1c without perceiving the diode 2. For this reason, the high-frequency signal is less likely to be affected by the diode 2 and it is thereby possible to reduce insertion loss of the diode 2.

$$Z_d > \frac{Z_i Z_o}{2Z_i + Z_o} \quad (2)$$

Figure 3:
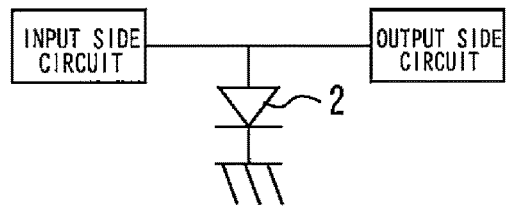
FIG. 3 is a block diagram illustrating a linearizer according to a comparative example.
Figure 4:
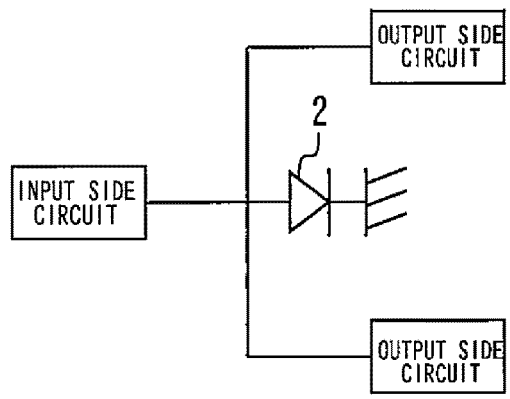
FIG. 4 is a block diagram illustrating a linearizer according to a first embodiment of the present invention.

FIG. 3 is a block diagram illustrating a linearizer according to a comparative example. FIG. 4 is a block diagram illustrating a linearizer according to a first embodiment of the present invention. While there is only one output side circuit in the comparative example, there are two output side circuits in the present embodiment. For this reason, an impedance Zc of the branch circuit 1 in the present embodiment is lower than that in the comparative example as shown in equation (3). Thus, high-frequency signals are less likely to be affected by the diode 2, and it is thereby possible to reduce insertion loss of the diode 2.

$$Z_c = \frac{Z_i Z_o}{Z_i + Z_o} > \frac{Z_i Z_o}{2Z_i + Z_o} \quad (3)$$

Therefore, even using the diode 2 having a large unit anode width Wau whose insertion loss is likely to increase, it is possible to reduce insertion loss. The diode 2 having a large unit anode width Wau has a smaller characteristic variation and thereby has a high manufacturing yield. Thus, the present embodiment can increase the yield while reducing insertion loss.

Figure 5:
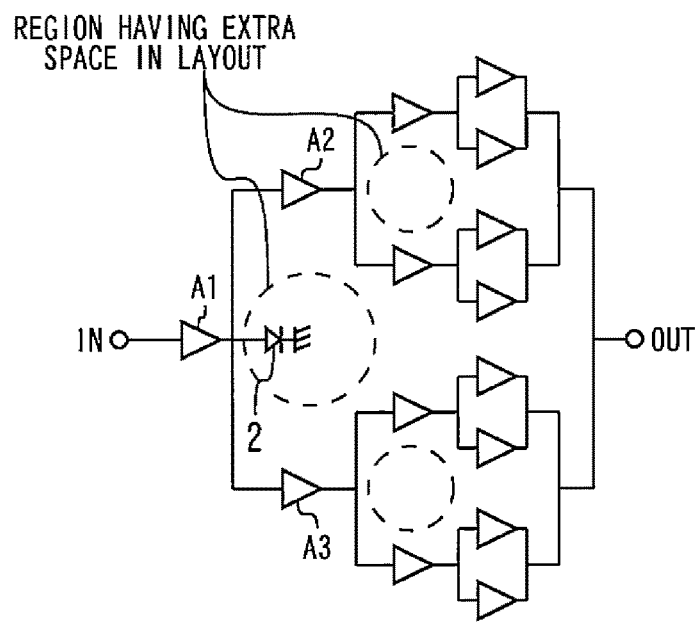
FIG. 5 is a diagram illustrating an amplifier with the linearizer according to the first embodiment of the present invention.

FIG. 5 is a diagram illustrating an amplifier with the linearizer according to the first embodiment of the present invention. When amplifiers A1 to A3 and the like are configured in a tournament form, there tends to be extra space in layout near a branch point. In the present embodiment, since the linearizer is provided at this branch point, it is possible to insert the linearizer while preventing the circuit area from increasing. This prevents the area occupied by an expensive epitaxial substrate from increasing, and can thereby reduce cost. It is also possible to facilitate the design of an amplifier with a linearizer. Moreover, the circuit pattern may be asymmetrically formed to operate the transistor in a balanced manner. A passive element such as a transmission line or resistor may be inserted between the branch point and the anode for impedance adjustment. If a negative voltage can be applied, the cathode may be connected to the branch point and the anode may be grounded. The bias circuit 3 is not limited to one capable of biasing in a forward direction, but may also be one capable of biasing in a backward direction. The bias circuit 3 also includes a circuit that is grounded via a resistor or inductor instead of one provided with a power supply terminal.

Second Embodiment

Figure 6:
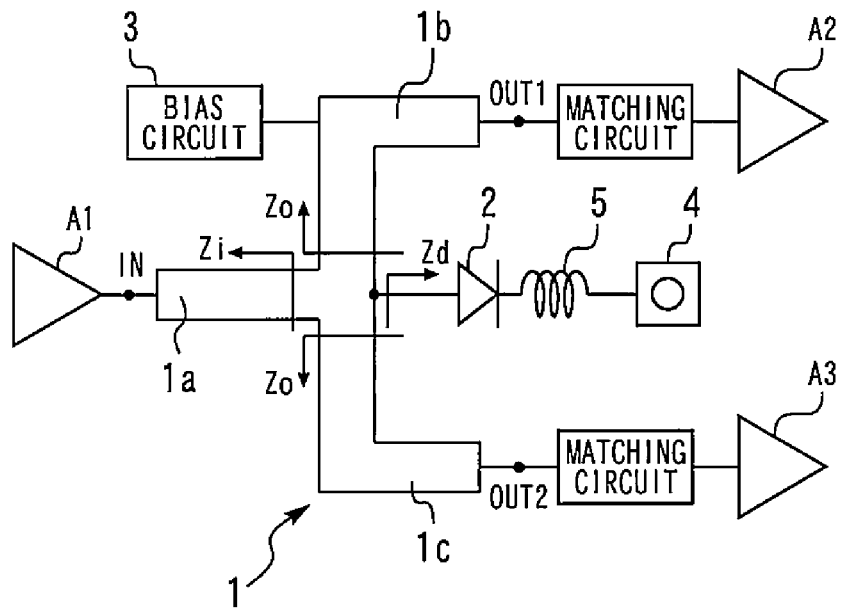
FIG. 6 is a diagram illustrating a linearizer according to a second embodiment of the present invention.

FIG. 6 is a diagram illustrating a linearizer according to a second embodiment of the present invention. The cathode of the diode 2 is grounded via a via hole 4. In a high-frequency band, an inductance of the via hole 4 cannot be ignored. Thus, in the present embodiment, an inductor 5 is connected between the cathode of the diode 2 and the ground. A design is performed assuming that the inductance of the via hole 4 is LVH and the inductance of the inductor 5 is Lc so as to satisfy equation (4).

$$Z_d + \omega(L_c + L_{VH}) > \frac{Z_i Z_o}{2Z_i + Z_o} \quad (4)$$

Figure 7:
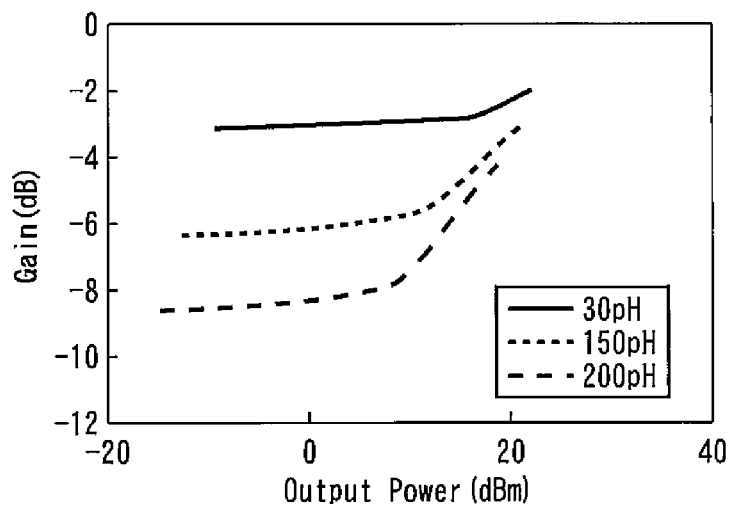
FIG. 7 is a diagram illustrating an AMAM characteristic of the linearizer according to the second embodiment of the present invention.

FIG. 7 is a diagram illustrating an AMAM characteristic of the linearizer according to the second embodiment of the present invention. An inductance component from the cathode of the diode to an ideal ground is used as a parameter. In the case of a substrate having a thickness of 100 μm, the inductance LVH of the via hole 4 is on the order of 30 pH.

When the cathode of the diode 2 is directly connected to the via hole 4, although passage loss is approximately 3 dB, the linearizer has such a characteristic that almost no dynamic range is assured after a gain improvement is started. On the other hand, when the inductance is 150 or 200 pH, a certain dynamic range can be assured after a gain improvement is started. Thus, if an inductance of, for example, 200 pH is necessary, since the inductance of the via hole 4 is 30 pH, an inductor 5 corresponding to the remaining 170 pH may be inserted. In the case of a GaN-MMIC using a 100 μm substrate using a common SiC substrate, 170 pH can be achieved by a micro strip line having a line width of 10 μm and a line length on the order of 250 um in a 10 GHz band, for example. Although the AMPM characteristic is not shown, a desired characteristic can be obtained by designing an appropriate matching circuit.

Third Embodiment

Figure 8:
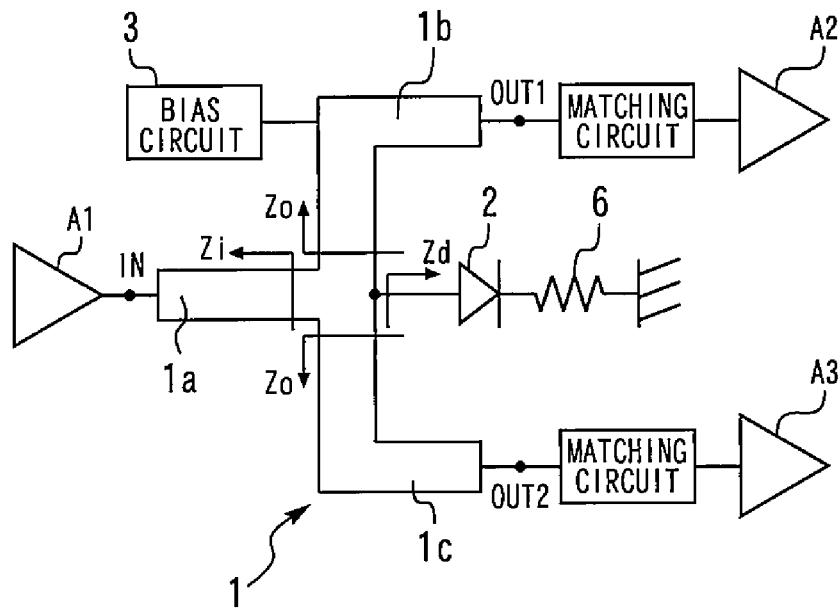
FIG. 8 is a diagram illustrating a linearizer according to a third embodiment of the present invention.

FIG. 8 is a diagram illustrating a linearizer according to a third embodiment of the present invention. A resistor 6 is connected between the cathode of the diode 2 and ground. A desired characteristic can be obtained by designing an appropriate matching circuit including the resistance value of this resistor 6. The rest of the configuration and effects are similar to those of the first embodiment.

Fourth Embodiment

Figure 9:
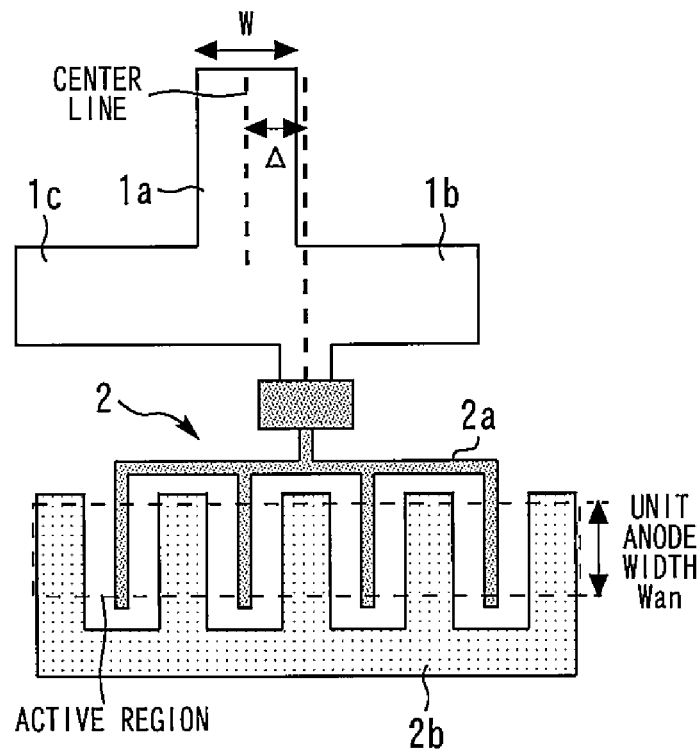
FIG. 9 is a partially enlarged view of a linearizer according to a fourth embodiment of the present invention.

FIG. 9 is a partially enlarged view of a linearizer according to a fourth embodiment of the present invention. A connection point at which the anode of the diode 2 is connected to the branch circuit 1 is deviated from an extension of a center line of the input transmission line 1a within a range which is three times a width W of the input transmission line 1a.

Figure 10:
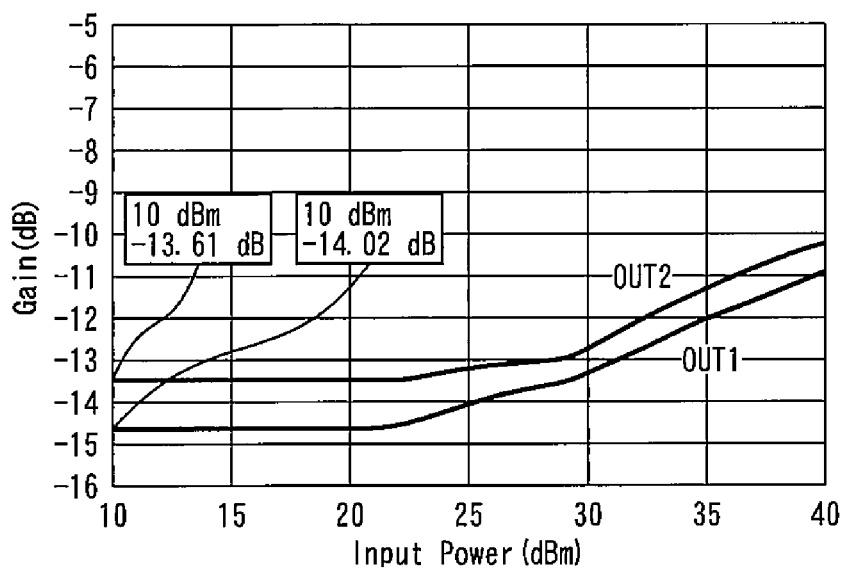
FIG. 10 is a diagram illustrating an AMAM characteristic of the linearizer according to the fourth embodiment of the present invention.

FIG. 10 is a diagram illustrating an AMAM characteristic of the linearizer according to the fourth embodiment of the present invention. An amount of deviation A is assumed to be equal to the width W of the input transmission line 1a. It is observed that the gain at the output terminal OUT2 is higher by approximately 1 dB than that at the output terminal OUT1.

Figure 11:
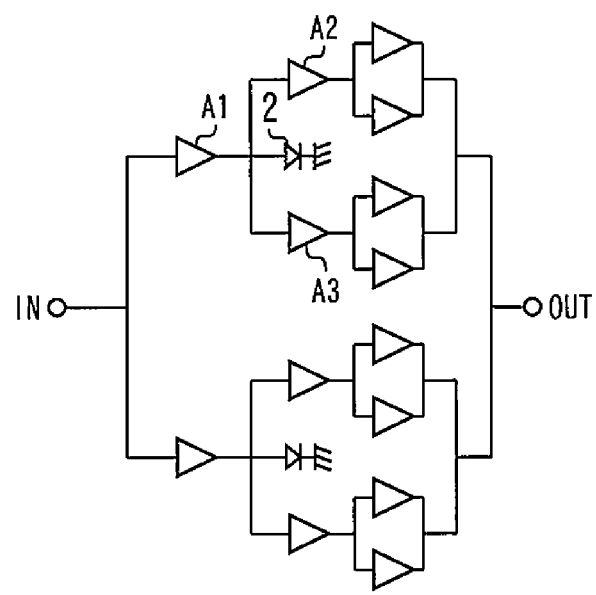
FIG. 11 is a diagram illustrating an amplifier with the linearizer according to the fourth embodiment of the present invention.
Figure 12:
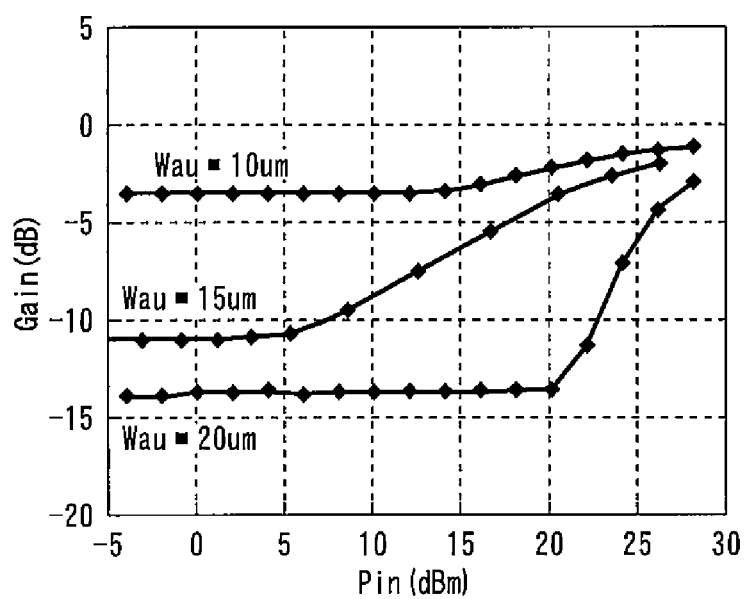
FIG. 12 is a diagram illustrating unit anode width Wau dependency of an AMAM characteristic of a linearizer.

FIG. 11 is a diagram illustrating an amplifier with the linearizer according to the fourth embodiment of the present invention. In such a tournament type 3-stage amplifier, it is generally difficult to dissipate heat in areas on the inside. For this reason, the gain of the amplifier A3 is smaller than that of the amplifier A2, showing a tendency that amplifiers A2 and A3 operate in an unbalanced manner. Since this is a vertically symmetric circuit, the same applies to the amplifiers in the lower part.

This unbalance is linked to the third stage and the degree of unbalance further increases in the third stage. In contrast, by adopting an asymmetric pattern of the branch circuit 1, it is possible to adjust input power to the amplifiers A2 and A3 and achieve a balanced operation. However, the asymmetric pattern of the branch circuit 1 requires a time-consuming electromagnetic field analysis to grasp its characteristic, which results in a problem that the development period extends. In contrast, according to the present embodiment, it is possible to adjust input power by only shifting the connection position of the diode 2, and thereby easily cause the transistor to operate in balanced manner. Only the connection position of the diode 2 is shifted in the present embodiment, but the circuit pattern may also be made asymmetric in addition thereto.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-107357 filed on May 23, 2014 including specification, claims, drawings and summary, on which the Convention priority of the present application is based, is incorporated herein by reference in its entirety.

What is claimed is:

1. A linearizer comprising:
   a branch circuit having an input transmission line connected between an input terminal and a branch point, a first output transmission line directly connected to the branch point and a first output terminal, and a second output transmission line directly connected to the branch point and a second output terminal;
   a diode having an anode directly connected to the branch point, and a cathode, the diode being separate from both the first transmission line and the second transmission line; and
   a bias circuit biasing the diode, wherein
   $Z_d$ is an impedance of the diode in a forward-biased state, $Z_i$ is an input impedance of the branch circuit seen from the branch point and $Z_o$ is an output impedance of the branch circuit, and $$Z_d > \frac{Z_i Z_o}{2Z_i + Z_o}$$

is satisfied.

2. The linearizer according to claim 1, further comprising an inductor connected to the cathode of the diode.

3. The linearizer according to claim 2, further comprising a via hole connected to the cathode of the diode.

4. The linearizer according to claim 1, further comprising a resistor connected to the cathode of the diode.

5. A linearizer comprising:
   a branch circuit having an input transmission line connected between an input terminal and a branch point, a first output transmission line connected between the branch point and a first output terminal, and a second output transmission line connected between the branch point and a second output terminal;
   a diode having an anode connected to the branch point and a cathode; and
   a bias circuit biasing the diode,
   wherein a connection point at which the anode of the diode is connected to the branch circuit is deviated from an extension of a center line of the input transmission line within a range which is three times a width of the input transmission line.

* * * * *